(12) United States Patent
Sahbari

(10) Patent No.: US 6,455,479 B1
(45) Date of Patent: Sep. 24, 2002

(54) STRIPPING COMPOSITION

(75) Inventor: Javad J. Sahbari, Sunnyvale, CA (US)

(73) Assignee: Shipley Company, L.L.C., Marlborough, MA (US)

(*) Notice: Subject to any disclaimer, the term of this patent is extended or adjusted under 35 U.S.C. 154(b) by 0 days.

(21) Appl. No.: 09/785,771

(22) Filed: Feb. 16, 2001

Related U.S. Application Data

(63) Continuation-in-part of application No. 09/632,282, filed on Aug. 3, 2000, now abandoned.

(51) Int. Cl.[7] .............................. C11D 7/26; C11D 7/32; B08B 3/04
(52) U.S. Cl. ................... 510/175; 510/176; 510/212; 134/1.3; 134/2; 134/3; 438/669; 438/745
(58) Field of Search .................... 134/1.3, 2, 3, 26, 134/38, 42; 430/331, 329, 256; 438/669, 745; 510/175, 176, 212; 252/79.3

(56) References Cited

U.S. PATENT DOCUMENTS

| 4,143,119 A | 3/1979 | Asperger et al. |
| 4,371,447 A | 2/1983 | Webb et al. |
| 4,765,844 A | 8/1988 | Merrem et al. |
| 4,820,344 A | 4/1989 | Geke et al. |
| 4,959,177 A | 9/1990 | Schutt |
| 5,391,234 A | 2/1995 | Murphy |
| 5,417,877 A | 5/1995 | Ward |
| 5,472,830 A | 12/1995 | Honda |
| 5,523,025 A | 6/1996 | Erilli |
| 5,529,709 A | 6/1996 | Rockenfeller |
| 5,556,482 A | 9/1996 | Ward et al. |
| 5,561,105 A | 10/1996 | Honda |
| 5,795,702 A | * 8/1998 | Tanabe et al. |
| 5,911,835 A | 6/1999 | Lee et al. |
| 5,962,197 A | 10/1999 | Chen |
| 5,988,186 A | * 11/1999 | Ward et al. |

FOREIGN PATENT DOCUMENTS

| JP | 99016882 | 1/1999 |
| WO | WO 97/48023 | 12/1997 |

* cited by examiner

Primary Examiner—Gregory E. Webb
(74) Attorney, Agent, or Firm—S. Matthew Cairns

(57) ABSTRACT

Disclosed are compositions and methods useful for the removal of polymeric material from substrates, such as electronic devices. The compositions and methods disclosed are particularly suitable for removing polymer residues from advanced integrated circuit devices with reduced corrosion of metal surfaces.

15 Claims, 2 Drawing Sheets

STRIPPING COMPOSITION

This application is a continuation-in-part of copending application Ser. No. 09/632,282 filed on Aug. 3, 2000 now abandoned.

BACKGROUND OF THE INVENTION

The present invention relates to the field of removal of polymeric materials from a substrate. In particular, the present invention relates to compositions and methods for the removal of residues left behind after plasma etch and ash process of silicon wafers used in manufacturing electronic devices.

Numerous materials containing polymers are used in the manufacture of electronic devices, such as circuits, disk drives, storage media devices and the like. Such polymeric materials are found in photoresists, solder masks, antireflective coatings, and the like. During manufacture of such electronic devices, the polymeric material is subjected to special processes and treatment conditions such as halogen or halide plasma etch, auto-plasma ash processing, reactive ion etching and ion milling that cause extensive cross-linking of the photoresist polymer and make the removal of such cross-linked polymeric material extremely difficult.

For example, modern technology utilizes positive-type resist materials for lithographically delineating patterns onto a substrate so that the patterns can be subsequently etched or otherwise defined into the substrate material. The resist material is deposited as a film and the desired pattern is defined by exposing the resist film to energetic radiation. Thereafter the exposed regions are subject to a dissolution by a suitable developer liquid. After the pattern has been thus defined in the substrate the resist material must be completely removed from the substrate to avoid adversely affecting or hindering subsequent operations or processing steps.

It is necessary in such a photolithographic process that the photoresist material, following pattern delineation, be evenly and completely removed from all unexposed areas so as to permit further lithographic operations. Even the partial remains of a resist in an area to be further patterned is undesirable. Also, undesired resist residues between patterned lines can have deleterious effects on subsequent processes, such as metallization, or cause undesirable surface states and charges.

Plasma etching, reactive ion etching and ion milling are required as the geometry of features get smaller and pattern density increases. During the plasma etch process, a photoresist film forms a hard to remove organometallic polymeric residue on the side walls of the various features being etched. Furthermore, the photoresist is extensively cross-linked due to the high vacuum and high temperature conditions in the etch chamber. Known cleaning processes do not acceptably remove such polymeric residue. For example, acetone or N-methylpyrrolidone is used at extreme conditions, which include high temperature and extended cycle times. Such use conditions are often above the flash point of the solvent which has certain environmental, health and safety issues regarding operator exposure. In addition, productivity and throughput are adversely affected by the extended process cycle times required. Even with such extreme stripping conditions, the devices typically need manual "swabbing", or brushing, to remove tenacious "rabbit ear"-type polymeric residue from the fine features.

In recent years, the semiconductor manufacturing industry has moved to dry plasma etching processes of metal and oxide layers in order to achieve the desired features with sub-half micron geometry. As a result, the need for photoresist and polymer removers that work effectively without damaging the integrity of fine feature microcircuit lines has drastically increased. Known photoresist removal or stripping formulations that typically contain strong alkaline solutions, organic polar solvents or strong acids and oxidizing agents are no longer applicable for those cross-linked polymers. Typical organic polar solvents used in conventional stripping formulations include pyrrolidones such as N-methylpyrrolidone, N-ethylpyrrolidone, N-hydroxyethylpyrrolidone and N-cyclohexylpyrrolidone; amides including dimethylacetamide or dimethylformamide; phenols and derivatives thereof. Such solvents have been used in combination with amines or other alkaline components that are effective in photoresist stripping. These compositions are not effective in post plasma polymer removal applications.

Recently, aqueous mixtures of hydroxylamine and alkanolamines along with different chelating agents have been used. For example, U.S. Pat. No. 5,334,332 (Lee) discloses compositions for removing etching residue containing 5 to 50% hydroxylamine, 10 to 80% of at least one alkanolamine and water. U.S. Pat. No. 4,401,747 (Ward et al.) discloses a stripping composition containing 30 to 90% 2-pyrrolidone and 10 to 70% dialkyl sulfone. Also, U.S. Pat. No. 5,795,702 (Tanabe et al.) discloses a stripping composition that contains 2 to 30% of hydroxylamine, 2 to 20% of an amine, 35 to 80% of a water soluble organic solvent in water with 2 to 20% of a corrosion inhibitor.

The above described compositions may be effective on typical Al/Si wafers that contain titanium nitride ("TiN") as cap layers and barrier layers, however, they are not applicable to 100% copper devices, or devices with high percentage of copper and low dielectric constant ("low-k") dielectric materials. These compositions are also corrosive to other corrosion sensitive alloys, such as tungsten, gallium or gallium arsenide, that are mainly used in modem chip manufacturing technology. Soft metals, such as copper and tungsten, are easily corroded by any hydroxylamine containing materials. Further, the strong tendency of copper for complex formation with hydroxylamine makes using such products undesirable for 100% copper or alloys having high copper content.

In addition, known stripping compositions containing hydroxylamine have numerous other drawbacks including, undesirable flammability, explosion hazard, toxicity, volatility, odor, instability at elevated process temperatures such as up to 80° to 90° C., and high cost due to handling such regulated materials. A particular problem with advanced devices, such as magnetic thin film heads for disk drives and storage media devices, is that known stripping compositions are incompatible with a variety of thin films in such devices, that is, conventional stripping compositions cause corrosion of the thin metal layers, particularly copper, and low-k dielectric material present in such advanced devices.

Furthermore, industrial grade hydroxylamine free base has high ionic contamination that cannot be used for electronic applications. Further purification is therefore necessary to convert the technical grade material to an electronic grade product. Purification of hydroxylamine free base via distillation processes has recently caused several fatal explosions, making handling of such high purity material extremely dangerous.

U.S. Pat. No. 5,988,186 (Ward et al.) discloses stripping compositions having at least about 10% by weight water, a water soluble polar solvent, an organic amine and gallic acid or a gallic acid ester. This patent does not disclose a combination of a polyhydric alcohol and a polar organic solvent.

U.S. Pat. No. 5,561,105 (Honda) discloses a photoresist stripping composition including an organic polar solvent having a dipole moment of more than 3.5; an amine compound selected from compounds having a certain formula, an a chelating reagent comprising a mono- or poly-valent acid ligand covalently bonded to a polymeric or oligomeric backbone. This patent does not disclose polyhydric alcohols, nor compositions free of an acid-type ligand.

There is thus a continuing need for strippers that effectively remove polymeric material, are more environmentally friendly, are less dangerous to manufacture and do not cause corrosion of the substrate, particularly thin metal films and the dielectric layers in the substrate.

SUMMARY OF THE INVENTION

It has been surprisingly found that polymeric material may be easily and cleanly removed from substrates, particularly 100% copper substrates and thin film heads for disk drives and storage media devices. Such polymeric material may be removed according to the present invention without corrosion of underlying metal layers, specifically copper, copper alloys, tungsten and gallium.

In one aspect, the present invention provides a composition for the removal of polymeric material from a substrate including one or more polyhydric alcohols, water, one or more water-miscible amines, and one or more polar solvents.

In a second aspect, the present invention provides a method of removing polymeric material from a substrate including the step of contacting a substrate containing polymeric material to be removed with the composition described above.

In a third aspect, the present invention provides a method for manufacturing an electronic device including a substrate including one or more metals and one or more polymeric materials, including the steps of contacting the substrate containing polymeric material to be removed with a composition including one or more polyhydric alcohols, water, one or more water-miscible amines, and one or more polar solvents.

DETAILED DESCRIPTION OF THE INVENTION

Figure 1:
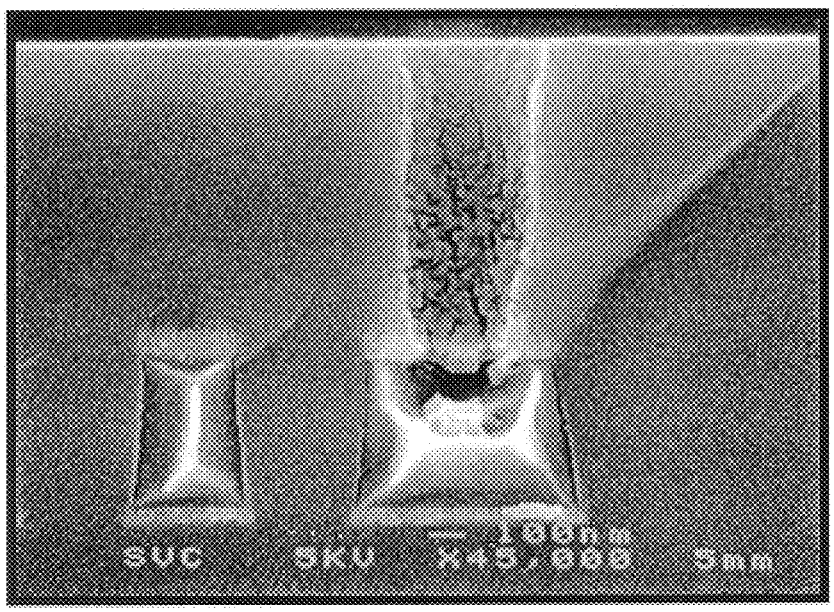
FIG. 1 is a scanning electron micrograph ("SEM") of a wafer having vias containing sidewall polymer.

As used throughout this specification, the following abbreviations shall have the following meanings unless the context clearly indicates otherwise: g=gram; ° C.=degrees Centigrade; ppm=parts per million; Å =angstrom; % wt=percent by weight; min=minute; cm =centimeter; ml=milliliter; MP-diol=2-methyl-1,3-propanediol; DPM= dipropylene glycol monomethyl ether; AEEA= aminoethylaminoethanol; DMSO=dimethyl sulfoxide; TBC=tert-butylcatechol; BTA=benzotriazole; MIPA= monoisopropanolamine; PDO=1,3-propanediol; AMP=3-amino-1-propanol; and EDA=ethylenediamine. All percentages are by weight. All numerical ranges are inclusive and combinable in any order, except where it is obvious that such numerical ranges are constrained to add up to 100%.

The terms "stripping" and "removing" are used interchangeably throughout this specification. Likewise, the terms "stripper" and "remover" are used interchangeably. "Stripping" refers to the removal of bulk polymeric material, such as photoresists and antireflective coatings, from a substrate and to the removal of polymeric residue after etching. The term "stripper" does not include developers which remove unpolymerized photoresist and leave an exact copy of the pattern on the mask or reticle. "Alkyl" refers to linear, branched and cyclic alkyl. As used throughout this specification, the term "aprotic" refers to compounds that do not accept or yield a proton.

The compositions of the present invention include one or more polyhydric alcohols, water, one or more water-miscible amines, and optionally one or more polar solvents. "Polyhydric alcohol" refers to any alcohol having two or more hydroxy groups, such as $(C_2-C_{20})$alkanediols, $(C_2-C_{20})$alkanetriols, substituted $(C_2-C_{20})$alkanediols, substituted $(C_2-C_{20})$alkanetriols, and the like. Suitable polyhydric alcohols include, but are not limited to, ethylene glycol, diethylene glycol, triethylene glycol, polyethylene glycol, propylene glycol, dipropylene glycol, tripropylene glycol, polypropylene glycol, 1,3-propanediol, 2-methyl-1,3-propanediol, butanediol, pentanediol, hexanediol, glycerol, and the like. It is preferred that the polyhydric alcohol is 1,3-propanediol, 2-methyl-1,3-propanediol, butanediol or glycerol, and more preferably 1,3-propanediol and 2-methyl-1,3-propanediol.

The polyhydric alcohols of the present invention are typically used in an amount of from about 5 to about 65% wt, based on the total weight of the composition. It is preferred that the polyhydric alcohols are present from about 20 to about 60% wt, and more preferably from about 25 to about 50% wt. Such polyhydric alcohols are generally commercially available and may be used without further purification.

Any grade of water may be used in the present invention, such as deionized or distilled. It is preferred that deionized ("DI") water is used. An advantage of the present invention is that large amounts of water can be used, such as up to about 75% wt. The amount of water is preferably from about 5 to about 55% wt, based on the total weight of the composition. More preferred amounts of water are from about 10 to about 40% wt, and still more preferably from about 10 to about 35% wt. A particularly suitable amount of water is from about 5 to about 50% wt.

Typically, as the amount of water increases above about 20% wt, the amount of corrosion increases. Such corrosion can be reduced through the use of a corrosion inhibitor. In an alternative embodiment, such corrosion can be reduced through the addition of a sulfur-containing polar cosolvent to the present compositions. Thus, the present invention further provides a method of reducing metal corrosion in an electronic device substrate during contact of the substrate with an aqueous polymer striping composition material including the step of adding a sulfur-containing polar solvent to the stripping composition. In general, as the amount of such sulfur-containing polar solvent is increased, the likelihood of metal corrosion due to contact with aqueous polymer stripping compositions is reduced. Thus, as the amount of water in a polymer remover composition increases, it is preferred that the amount of corrosion inhibitor, sulfur-containing polar solvent or both is increased, and more preferably that the amount of sulfur-containing polar solvent is increased. It is further preferred that as the amount of water in a polymer remover is increased, the amount of sulfur-containing polar solvent is increased proportionately. Preferred stripping compositions of the present invention include one or more corrosion inhibitors and one or more sulfur-containing polar solvents. Suitable sulfur-containing cosolvents include, but are not limited to, dimethylsulfoxide and sulfolane.

Any water-miscible amine may used in the present compositions. Suitable water-miscible amines include, but are not limited to, alkyleneamines such as ethylenediamine, diethylenetriamine, triethylenetetraamine, propylenediamine and the like; aminoalcohols such as aminoethylaminoethanol, ethanolamine, diethanolamine, triethanolamine, monoisopropanolamine, diisopropanolamine, 3-amino-1-propanol and the like. Aminoethylaminoethanol, 3-amino-1-propanol, monoisopropanolamine and ethylenediamine are preferred. Particularly suitable water-miscible amines are those capable of chelating one or more metal ions, such as ethylenediamine, diethylenetriamine, triethylenetetraamine and 3-amino-1-propanol.

The water-miscible amines are typically used in an amount of from about 5 to about 65% wt, based on the total weight of the composition. Preferred amounts of the water-miscible amines are from about 10 to about 60% wt and more preferably from about 20 to about 50% wt. The water-miscible amines are generally commercially available, such as from Aldrich (Milwaukee, Wis.), and may be used without further purification.

Any polar solvent that is water-miscible and compatible with the present compositions may be used. Suitable polar solvents include polar aprotic solvents, dimethylformamide, dimethylacetamide, γ-butyrolactone and glycol ethers such as $(C_1-C_6)$alkyl ethers of $(C_2-C_{20})$alkanediols or di$(C_1-C_6)$ alkyl ethers of $(C_2-C_{20})$alkanediols. Suitable polar aprotic solvents include, but are not limited to, dimethyl sulfoxide and sulfolane, and preferably dimethyl sulfoxide. Such polar aprotic solvents are generally commercially available, such as from Aldrich (Milwaukee, Wis.), and may be used without further purification.

Suitable glycol ethers include, but are not limited to, ethylene glycol monomethyl ether, diethylene glycol monomethyl ether, propylene glycol monomethyl ether, propylene glycol dimethyl ether, propylene glycol mono-n-butyl ether, dipropylene glycol monomethyl ether, dipropylene glycol dimethyl ether, dipropylene glycol mono-n-butyl ether, tripropylene glycol monomethyl ether, and the like. Suitable glycol ethers are those sold under the DOWANOL tradename such as DOWANOL DPM, DOWANOL TPM, DOWANOL PNB, and DOWANOL DPNB all available from Dow Chemical Company (Midland, Mich.).

Typically, the polar solvent used in the present invention is in the range of about 5 to about 50% wt, based on the total weight of the composition. It is preferred that the amount of polar solvent is in the range of about 10 to about 45% wt, more preferably from about 10 to about 35% wt and still more preferably from about 15 to 25% wt.

Mixtures of polar solvents may be advantageously used in the present invention. It is preferred that when a mixture of polar solvents is used that at least one solvent is selected from diemthylsulfoxide, sulfolane and dipropylene glycol monomethyl ether. When more than one polar solvent is used in the present invention, the solvents may be combined in any ratio, from about 99:1 to about 1:99 by weight.

It will be appreciated by those skilled in the art that one or more secondary solvents may be used in the present compositions. Such secondary solvents include, but are not limited to, $(C_1-C_6)$alkylpyrrolidinones such as N-methylpyrrolidinone, N-ethylpyrrolidinone, N-hydroxyethylpyrrolidinone and N-cyclohexylpyrrolidinone.

The present compositions may additionally include one or more other components, such as corrosion inhibitors, wetting agents or surfactants, anti-freeze agents, viscosity modifiers and the like, and preferably corrosion inhibitors or wetting agents. Suitable corrosion inhibitors useful in the present invention include, but are not limited to, catechol; $(C_1-C_6)$alkylcatechol such as methylcatechol, ethylcatechol and tert-butylcatechol; benzotriazole; $(C_1-C_{10})$ alkylbenzotriazoles; gallic acid; gallic acid esters such as methyl gallate and propyl gallate; and the like. It is preferred that the corrosion inhibitor is catechol, $(C_1-C_6)$ alkylcatechol, benzotriazole or $(C_1-C_{10})$ alkylbenzotriazoles, and more preferably benzotriazole or tert-butylcatechol. When such corrosion inhibitors are used they are typically present in an amount in the range of about 0.01 to 10% wt, based on the total weight of the stripping composition. It is preferred that the amount of corrosion inhibitor is from about 0.2 to about 5% wt, more preferably about 0.5 to about 4% wt, and most preferably from about 1.5 to about 3% wt. It is preferred that at least one corrosion inhibitor be used in the stripping compositions of the present invention. It will also be appreciated by those skilled in the art that more than one corrosion inhibitor may be advantageously used. Such corrosion inhibitors are generally commercially available from a variety of sources, such as Aldrich Chemical Company (Milwaukee, Wis.).

Nonionic and anionic surfactants may be used with the stripping compositions of the present invention. Nonionic surfactants are preferred. Such surfactants are generally commercially available. Typically, such surfactants are used in an amount of from about 0.2 to about 5% wt, preferably from about 0.5 to about 5% wt, and more preferably from about 1.5 to about 3.5% wt, based on the total weight of the composition.

Particularly suitable compositions include from about 5 to about 65% wt of a polyhydric alcohol selected from 1,3-propanediol, 2-methyl-1,3-propanediol, butanediol or glycerol, from about 5 to about 40% wt water, from about 5 to about 65% wt of one or more water-miscible amines selected from aminoethylaminoethanol, ethanolamine, diethanolamine, triethanolamine, monoisopropanolamine, diisopropanolamine, ethylenediamine, diethylenetriamine and triethylenetetraamine, from about 5 to about 50% wt of one or more polar solvents selected from dimethyl sulfoxide, sulfolane, ethylene glycol monomethyl ether, diethylene glycol monomethyl ether, propylene glycol monomethyl ether, propylene glycol dimethyl ether, propylene glycol mono-n-butyl ether, dipropylene glycol monomethyl ether, dipropylene glycol dimethyl ether, and dipropylene glycol mono-n-butyl ether, and from about 0.2 to about 5% wt of a corrosion inhibitor selected from catechol, $(C_1-C_6)$ alkylcatechol, benzotriazole or $(C_1-C_{10})$ alkylbenzotriazoles.

The compositions of the present invention may be prepared by combining the one or more polyhydric alcohols, water, one or more water-miscible amines, one or more polar solvents and one or more optional components such as corrosion inhibitors or wetting agents, in any order. It is preferred that the water-miscible amine is dissolved in water and polyhydric alcohol mixture along with the polar solvent followed by and any other optional components.

The compositions of the present invention are suitable for removing polymeric material from a substrate. Suitable polymeric material that can be removed by the present invention is any residue from photoresists, soldermasks, organic antireflective coatings, and the like. Typical polymeric antireflective coatings include a chromophore, a polymeric binder and one or more cross-linking agents. The compositions of the present invention are particularly useful in removing the polymeric residue present after plasma etching, reactive ion etching and ion milling of materials, such as photoresists. Such polymeric residue remaining after plasma etching, reactive ion etching and ion milling is typically organometallic polymeric residue. Such organometallic residue is typically referred to as "sidewall polymer."

Polymeric residue on a substrate may be removed by contacting the substrate with a composition of the present invention. The substrate may be contacted with the compositions of the present invention by any known means, such as placing the coated wafers in a hot bath of the stripping solvent, like a wet chemical bench, or by putting the wafers in a spray equipment chamber such as that available from Semitool, Inc. (Kalispell, Mont.), followed by a deionized water spin, rinse and dry process.

An advantage of the process of the present invention is that lower temperatures may be used than those used with known stripping compositions. Typically, the polymeric residue removal process of the present invention may be carried out at any temperature, such as from room temperature up to about 100° C., preferably from about 35° to about 90° C., more preferably from about 50° C. to about 85° C., and most preferably from about 70° to about 80° C. The polymer to be removed is typically contacted with the present compositions for a period of time sufficient to at least partially remove the polymer residue. Typically, the polymer to be removed is contacted with the present compositions for up to 60 minutes, preferably up to 45 minutes and more preferably from about 5 to about 30 minutes.

Thus, the present invention provides a method for manufacturing an electronic device including a substrate containing one or more metals and one or more polymeric materials, including the steps of contacting the polymeric material to be removed with a composition including one or more polyhydric alcohols, water, one or more water-miscible amines, and one or more polar solvents for a period of time sufficient to remove the polymeric material and rinsing the substrate.

The present compositions are free of hydroxylamine and metal-ions. It is preferred that the present compositions are free of acid-type chelating agents such as ethylenediaminetetraacetic acid, and free of alkylpyrrolidones such as N-methylpyrrolidone. It is also preferred that the present compositions are free of tetraalkylammonium hydroxide such as tetramethylammonium hydroxide. It is further preferred that the present compositions are free of alkali metal hydroxide, fluoride ion and amino acids. It is still further preferred that the present compositions are free of a chelating reagent comprising a mono- or poly-valent acid type ligand covalently bonded to a polymeric or oligomeric backbone. In general, the present compositions are alkaline and preferably have a pH in the range of about 9 to about 11.

The present compositions are also useful in the manufacture of magnetic thin film heads and opto-electronic devices. Thus, the present invention provides a method for manufacturing magnetic thin film heads and opto-electronic devices including the steps of contacting a magnetic thin film head precursor or opto-electronic device containing polymeric material to be removed with a composition including one or more polyhydric alcohols, water, one or more water-miscible amines, and one or more polar solvents for a period of time sufficient to remove the polymeric material and rinsing the substrate.

An advantage of the compositions of the present invention is they are highly effective in removing post plasma etch residues when other conventional strippers are not capable of removing such residues. Furthermore the present compositions provide stripping baths having prolonged stripping capacity and are substantially non-corrosive to substrates containing metals, particularly copper, copper alloys, tungsten, gallium and gallium alloys. Another advantage of the compositions of the present invention is that they are highly effective in complete removal of the post ash residues of the deep UV photoresist coated on a layer of hard to remove organic antireflective coating polymer. It is well known in the industry that such organic antireflective coating residues that are cross-linked polymeric material are very difficult to clean by conventional resist strippers.

The compositions of the present invention are extremely effective in removing post plasma etch polymers from different substrates on silicon wafers, flat panel display plates and any other device that has undergone dry plasma etch process.

The following examples are intended to illustrate further various aspects of the present invention, but are not intended to limit the scope of the invention in any aspect.

EXAMPLE 1

This example illustrates the results of polymer removal capability of compositions of the present invention. The stripping compositions evaluated are reported in Table 1. Aluminum-copper-silicon ("Al—Cu—Si") wafers (8 inch, 20 cm) were coated with UV-86 or UVN-110 brand series of deep UV photoresist (available from Shipley Company, Marlborough, Mass.). The photoresist was hard baked, processed and then plasma etched using a typical dry etch process on a commercially available plasma etcher followed by an oxygen plasma ash process. The wafers were then immersed in a 500 ml bath of the stripping composition which was heated at 85° C. Following immersion for 20 minutes, the wafers were then rinsed with deionized ("DI") water and dried under a stream of nitrogen. The wafers were then evaluated for remaining polymer residues by scanning electron microscopy ("SEM") using a JEOL 6320 field emission scanning electron microscope (FE-SEM). A number of the wafers having titanium nitride-aluminum-titanium nitride layers were evaluated for sidewall polymer removal. Other of the wafers were evaluated to contavt via polymer removal. The stripping results are reported in Table 2.

TABLE 1

| Sample | Composition |
|---|---|
| 1 | 25% MP-diol/38% AEEA/15% DPM/20% $H_2O$/2% TBC |
| 2 | 25% MP-diol/35% AEEA/20% DMSO/18% $H_2O$/2% TBC |
| 3 | 30% MP-diol/35% MIPA/18% DPM/15% $H_2O$/2% TBC |
| 4 | 30% MP-diol/30% AEEA/20% DPM/18% $H_2O$/2% BTA |

TABLE 1-continued

| Sample | Composition |
|---|---|
| 5 | 22% MP-diol/38% MIPA/15% Sulfolane/22.5% H₂O/2.5% BTA |
| 6 | 25% MP-diol/35% MIPA/18% DMSO/15% H₂O/2% BTA |
| 7 | 6% MP-diol/40% EDA/25% DMSO/25% H₂O/4% TBC |
| 8 | 6% MP-diol/45% EDA/25% DMSO/20% H₂O/4% TBC |
| 9 | 9% PDO/42% AMP/24% DMSO/22% H₂O/3% BTA |
| 10 | 5% MP-diol/35% EDA/30% DMSO/25% H₂O/5% TBC |
| 11 | 8% MP-diol/42% MIPA/22% Sulfolane/24% H₂O/4% BTA |
| 12 | 6% PDO/40% EDA/25% DMSO/25% H₂O/4% TBC |
| 13 | 5% MP-diol/30% EDA/35% DMSO/25% H₂O/5% TBC |
| 14 | 10% MP-diol/40% AEEA/22% DMSO/25% H₂O/3% TBC |

Samples 1–6 and 14 were particularly suitable for the stripping or removal of polymeric material from conventional processes, including sidewall polymer resulting from conventional plasma etching. Samples 7–13 were particularly suitable for use in removing polymeric residue from substrates that were over-etched with fluorine-rich higher density plasmas. Such plasmas generate particularly thick and difficult to remove sidewall polymers.

TABLE 2

| Sample | TiN/Al/TiN (Sidewall Polymers) | Stripping Results (Contact Via Polymer) |
|---|---|---|
| 1 | Polymer 95–98% removed | Polymer 100% removed |
| 2 | Polymer 100% removed (Excellent) | Polymer 100% removed (Excellent) |
| 3 | Polymer 95–98% removed | Polymer 95% removed |
| 4 | Polymer 95–98% removed | Polymer 95% removed |
| 5 | Polymer 95–98% removed | Polymer 100% removed |
| 6 | Polymer 100% removed (Excellent) | Polymer 100% removed (Excellent) |
| 7 | Polymer 100% removed/ no corrosion | Polymer 100% removed |
| 8 | Polymer 100% removed (Excellent)/no corrosion | Polymer 100% removed (Excellent) |
| 9 | Polymer 95–98% removed/ slight Al corrosion | Polymer 95% removed |
| 10 | Polymer 100% removed (Excellent)/no corrosion | Polymer 100% removed |
| 11 | Polymer 95–98% removed | Polymer 98% removed |
| 12 | Polymer 100% removed (Excellent)/no corrosion | Polymer 100% removed (Excellent) |

The above data clearly show that the compositions of the present invention are effective in removing polymeric material from substrates, particularly post plasma etch polymeric material and fluorine/aluminum rich organometallic sidewall polymer resulting from excessive over etching with fluorinated plasma.

EXAMPLE 2

The effect of DI water concentration in the stripper compositions was determined. A stripper composition pre-mix including 40% wt AEEA, 33% wt MP-diol, 25% wt DMSO and 2% wt tert-butylcatechol was prepared. This pre-mix was combined with DI water in varying amounts and the compositions used to remove polymeric material from a variety of wafers. After contact with the stripping compositions, the wafers were rinsed, dried and evaluated for corrosion of aluminum, copper, titanium and titanium nitride layers. The results are reported in Table 3. Each of the stripping compositions had a pH in the range of 10–11.

TABLE 3

| Pre-Mix (%) | DI Water (%) | Polymer Removing Efficacy | Al Corrosion | Cu Corrosion | Ti, Ti/N Corrosion |
|---|---|---|---|---|---|
| 85 | 15 | Fair | None detected | None detected | None detected |
| 82.5 | 17.5 | Excellent | None detected | Minor attack | None detected |
| 80 | 20 | Good | Slight | Slight | None detected |
| 75 | 25 | Fair | Moderate | Moderate | None detected |
| 70 | 30 | Poor | Corrosion | Corrosion | Minor undercut |

The above data show that the when the amount of water in the present compositions is high, that is about 25% wt or greater, corrosion of sensitive metal layers starts to occur. Thus, either additional corrosion inhibitor, sulfur-containing polar solvent or both is required to reduce such corrosion.

EXAMPLE 3

Two of the compositions prepared according to Example 1 were evaluated for their compatibility with various thin metal substrates. A variety of wafers containing one or more layers of aluminum-silicon ("Al—Si"), titanium ("Ti"), titanium nitride ("TiN"), copper ("Cu") and tungsten/titanium-tungsten ("W/Ti—W") were immersed in the stripping solutions for 60 minutes at 85° C. The samples were then evaluated for loss of metal. The results are reported in Table 4 as etch rates for each metal.

TABLE 4

| Sample | Al-Si | Ti | TiN | Cu | W/Ti-W |
|---|---|---|---|---|---|
| 2 | 3–4 Å/min | <1 Å/min | <1 Å/min | 2–3 Å/min | 3–4 Å/min |
| 3 | 3–4 Å/min | <1 Å/min | <1 Å/min | 2–3 Å/min | 3–4 Å/min |
| 8 | <1 Å/min | <1 Å/min | <1 Å/min | 1–2 Å/min | 1–2 Å/min |
| 10 | <1 Å/min | <1 Å/min | <1 Å/min | 1–2 Å/min | 1–2 Å/min |

These data clearly show that the compositions of the present invention do not significantly corrode sensitive metal layers.

EXAMPLE 4

Three of the compositions prepared according to Example 1 were evaluated for their compatibility with various dielectric materials. A variety of wafers containing one or more layers of silicon ("Si"), silicon dioxide ("SiO₂"), and hydridosilsesquioxane ("HSQ") were immersed in the stripping solutions for 30 minutes at 85° C. The samples were then evaluated for attack on the dielectric material layers. The results are reported in Table 5.

TABLE 5

| Sample | Si | SiO₂ | HSQ 1 | HSQ 2 |
|---|---|---|---|---|
| 1 | No attack | No attack | No attack | No attack |
| 2 | No attack | No attack | No attack | No attack |
| 3 | Slight attack | No attack | No attack | Slight attack |
| 8 | No attack | No attack | No attack | No attack |
| 10 | No attack | No attack | No attack | No attack |

These data show that the present compositions are compatible with a variety of dielectric materials use din the manufacture of electronic devices.

EXAMPLE 5

Samples 2 and 6 from Example 1 and three commercially available stripping compositions, Comparatives C-1, C-2 and C-3, were evaluated from their copper compatibility. The comparative compositions are reported in Table 6.

TABLE 6

| Sample | Composition |
| --- | --- |
| C-1 | 25% Hydroxylamine/62.5% diglycolamine/12.5% H2O/ 5% catechol |
| C-2 | 25% Hydroxylamine/60% monoethanolamine/10% H2O/ 5% catechol |
| C-3 | N-methylpyrrolidone/ethyleneamine |

Comparative samples C-1, C-2 and C-3 are commercially available stripping products.

Wafer chips, 2 inch×2 inch (5 cm×5 cm), containing electroplated copper (100% Cu) were heated in 100 ml of a stripper composition at 75° C. for 30 minutes. The copper plated chip was then moved and the stripper composition was tested for dissolved copper using a Hewlett Packard inductively coupled plasma mass spectrometer (HP-4500 ICP-MS) with cold shield plasma method. The amount of copper in the stripping solutions is reported in Table 7 in parts per billion ("ppb"). The etch rates are also reported.

TABLE 7

| Sample | Cu Level | Cu Etch Rate |
| --- | --- | --- |
| C-1 | 7865 ppb | — |
| C-2 | 8640 ppb | — |
| C-3 | 11060 ppb | — |
| 2 | 92 ppb | <1 Å/min |
| 6 | 96 ppb | <1 Å/min |

These data clearly show the compositions of the present invention are more compatible with copper than known stripping compositions.

EXAMPLE 6

Sample 2 from Example 1 is used to remove polymeric material from a wafer containing an indium tin oxide/tantalum ("ITO/Ta") layer on a glass flat panel display substrate. No major corrosion on any of the metal layers is seen.

EXAMPLE 7

Sample 2 from Example 1 is used to remove polymeric material from a wafer containing a niobium/aluminum/niobium ("Nb/Al/Nb") layer. No major corrosion on any of the metal layers is seen.

EXAMPLE 8

Magneto-resistive and giant magneto-resistive head wafers containing aluminum oxide ("$Al_2O_3$") thin films are contacted with various stripper compositions for 30 minutes. The lowest level of aluminum is seen in Sample 2 from Example 1, indicating the lowest amount of corrosion.

EXAMPLE 9

Sample wafers having high aspect ratio (8:1) vias with side wall polymers due to dry etching were immersed in a heated (85° C.) stripping bath of Sample 2. The wafers were immersed in the composition for 30 minutes, removed from the bath, rinsed with DI water and spin dried. A cross section SEM analysis was conducted to examine the cleanliness of the via side walls and corrosion on the Al contact layers. No visible sign of polymer residue was found nor was any sign of corrosion observed.

EXAMPLE 10

The polymer removing capabilities of the compositions of the invention were compared to those of hydroxylamine-containing compositions. A wafer containing highly oxidized over-etched sidewall polymer in vias was obtained. The wafer contained sidewall polymer that was very difficult to remove. FIG. 1 is a SEM showing the sidewall polymer in a via in the wafer. The wafer was first broken into identical pieces, and then the pieces were contacted with a stripping bath to remove the polymer.

Figure 2:
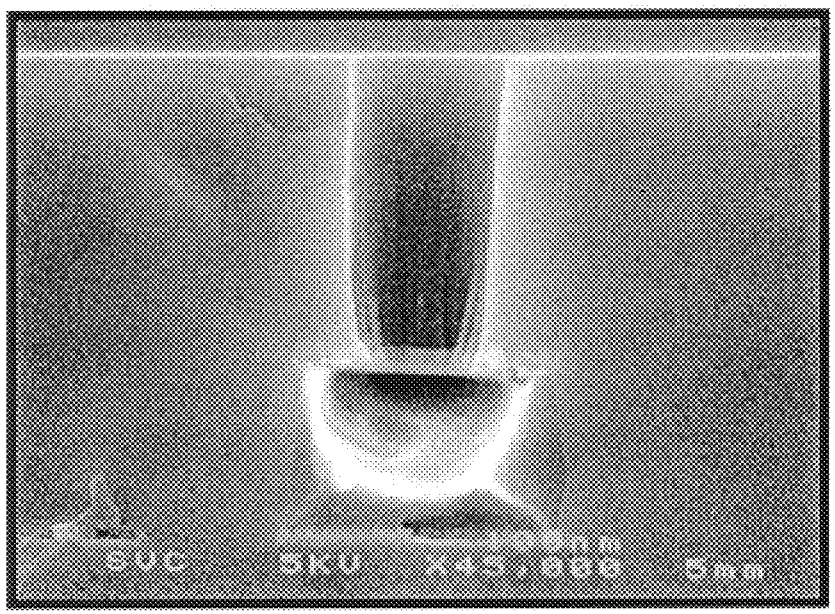
FIG. 2 is a SEM of the wafer shown in FIG. 1 after removal of the sidewall polymer using a composition of the invention.

Wafer piece A was immersed in a stripping bath of Sample 13 from Example 1 at 90° C. for 40 minutes. The wafer was removed from the bath, rinsed with DI water and spin dried. A cross section SEM analysis was conducted to examine the cleanliness of the via side walls and corrosion of the metal contact layers, and is shown in FIG. 2. No visible sign of polymer residue was found nor was any sign of undercut or corrosion observed.

Wafer piece B was immersed in a stripping bath of Sample 14 from Example 1 at 90° C. for 40 minutes. The wafer was removed from the bath, rinsed with DI water and spin dried. A cross section SEM analysis was conducted to examine the cleanliness of the via side walls and corrosion of the metal contact layers. Sidewall polymer remained after the stripping treatment.

Figure 3:
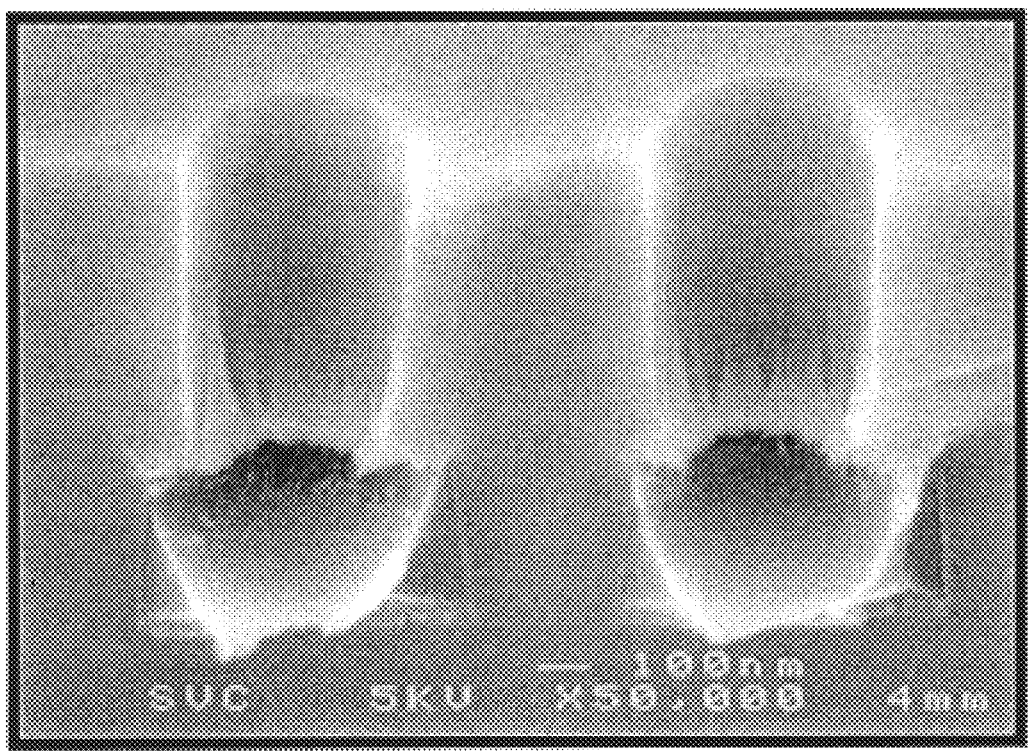
FIG. 3 is a SEM of the wafer shown in FIG. 1 after treatment with a conventional hydroxylamine-containing sidewall polymer remover.

Wafer piece C was immersed in a conventional stripping bath containing hydroxylamine, water, alkanolamine and a corrosion inhibitor (comparative) at 70° C. for 30 minutes. The wafer was removed from the bath, rinsed with DI water and spin dried. A cross section SEM analysis was conducted to examine the cleanliness of the via side walls and corrosion of the metal contact layers, and is shown in FIG. 3. No visible sign of polymer residue was found, however some corrosion of the metal contact layer was observed.

These data clearly indicate that the compositions of the present invention containing amines that are not alkanolamines are particularly effective at removing very difficult to remove sidewall polymers, such as highly oxidized over-etched via polymers. These data also show that the compositions of the invention are as effective at removing difficult sidewall polymers as hydroxylamine-containing strippers, but without the problems of hydroxylamine-containing strippers. These data further show that the present compositions are less corrosive than hydroxylamine-containing polymer removers.

What is claimed is:

1. A composition for the removal of polymeric material from a substrate, the composition consisting of one or more polyhydric alcohols selected from the group consisting of ($C_2$–$C_{20}$)alkanediols, ($C_2$–$C_{20}$)alkanetriols, substituted ($C_2$–$C_{20}$)alkanediols and substituted ($C_2$–$C_{20}$) alkanetriols, water, one or more water-miscible amines selected from the group consisting of alkyleneamines and aminoalcohols, and one or more polar solvents selected from the group consisting of polar aprotic solvents, dimethylformamide, dimethylacetamide, γ-butyrolactone and glycol ethers and 0.01 to 10% wt of one or more corrosion inhibitors.

2. The composition of claim 1 wherein the one or more polyhydric alcohols are selected from the group consisting of ethylene glycol, diethylene glycol, triethylene glycol, polyethylene glycol, propylene glycol, dipropylene glycol, tripropylene glycol, polypropylene glycol, 1,3-propanediol, 2-methyl-1,3-propanediol, butanediol, pentanediol, hexanediol and glycerol.

3. The composition of claim 1 wherein the one or more polyhydric alcohols are present in an amount of from about 5 to about 65% wt, based on the total weight of the composition.

4. The composition of claim 1 wherein the water is present in an amount of from about 5 to about 55% wt, based on the total weight of the composition.

5. The composition of claim 1 wherein the one or more water miscible amines are selected from the group consisting of ethylenediamine, diethylenetriamine, triethylenetetraamine, propylenediamine, aminoethylaminoethanol, ethanolamine, diethanolamine, triethanolamine, monoisopropanolamine, diisopropanolamine and 3-amino-1-propanol.

6. The composition of claim 1 wherein the amount of the one or more water-miscible amines is from about 5 to about 65% wt, based on the total weight of the composition.

7. The composition of claim 1 wherein the glycol ethers are selected from the group consisting of ethylene glycol monomethyl ether, diethylene glycol monomethyl ether, propylene glycol monomethyl ether, propylene glycol dimethyl ether, propylene glycol mono-n- butyl ether, dipropylene glycol monomethyl ether, dipropylene glycol dimethyl ether, dipropylene glycol mono-n-butyl ether and tripropylene glycol monomethyl ether.

8. The composition of claim 1 wherein the amount of one or more polar solvents is from about 5 to about 50% wt, based on the total weight of the composition.

9. A method of removing polymeric material from a substrate including the step of contacting a substrate containing polymeric material to be removed with the composition of claim 1.

10. A method for manufacturing an electronic device comprising a substrate containing one or more metals and one or more polymeric materials, comprising the step of contacting the substrate containing polymeric material to be removed with a composition consisting of one or more polyhydric alcohols selected from the group consisting of ($C_2$–$C_{20}$) alkanediols, ($C_2$–$C_{20}$)alkanetriols, substituted ($C_2$–$C_{20}$)alkanediols and substituted ($C_2$–$C_{20}$) alkanetriols, water, one or more water-miscible amines selected from the group consisting of alkyleneamines and aminoalcohols, one or more polar solvents selected from the group consisting of polar aprotic solvents, dimethylformamide, dimethylacemide, γ-butyrolactone and glycol ethers and 0.01 to 10% wt of one or more corrosion inhibitors.

11. A composition consisting of from about 5 to about 65% wt of a polyhydric alcohol selected from 1,3-propanediol, 2-methyl-1,3-propanediol, butanediol or glycerol; from about 5 to about 40% wt water; from about 5 to about 65% wt of one or more water-miscible amines selected from the group consisting of ethylenediamine, diethylenetriamine, triethylenetetraamine, propylenediamine, aminoethylaminoethanol, ethanolamine, diethanolamine, triethanolamine, monoisopropanolamine, diisopropanolamine and 3-amino-1- propanol; from about 5 to about 50% wt of one or more polar aprotic solvents selected from the group consisting of dimethyl sulfoxide, sulfolane, ethylene glycol monomethyl ether, diethylene glycol monomethyl ether, propylene glycol monomethyl ether, propylene glycol dimethyl ether, propylene glycol mono-n-butyl ether, dipropylene glycol monomethyl ether, dipropylene glycol dimethyl ether, and dipropylene glycol mono-n-butyl ether; and from about 0.2 to about 5% wt of a corrosion inhibitor selected from catechol, ($C_1$–$C_6$) alkylcatechol, benzotriazole or ($C_1$–$C_{10}$) alkylbenzotriazoles.

12. The composition of claim 1 wherein the one or more inhibitors are present in an amount of 0.2 to 5% wt.

13. The composition of claim 1 wherein the polar aprotic solvent is selected from the group consisting of dimethyl sulfoxide and sulfolane.

14. The composition of claim 1 wherein the one or more corrosion inhibitors are selected from the group consisting of catechol, ($C_1$–$C_6$)alkylcatechol, benzotriazole, ($C_1$–$C_{10}$) alkylbenzotriazoles, gallic acid and gallic acid esters.

15. A composition for the removal of polymeric material from a substrate, the composition consisting of one or more polyhydric alcohols selected from the group consisting of ($C_2$–$C_{20}$)alkanediols, ($C_2$–$C_{20}$)alkanetriols, substituted ($C_2$–$C_{20}$)alkanediols, and substituted ($C_2$–$C_{20}$)alkanetriols, water one or more water-miscible amines selected from the group consisting of alkyleneamines and aminoalcohols, one or more polar solvents selected from the group consisting of polar aprotic solvents, dimethylforamide, dimethylacetamide, γ-butyrolactone and glycol ethers, 0.01 to 10% wt of one or more inhibitors and 0.2 to 5% of one or more wetting agents.

* * * * *